(12) United States Patent
Tour et al.

(10) Patent No.: US 9,005,460 B2
(45) Date of Patent: Apr. 14, 2015

(54) LAYER-BY-LAYER REMOVAL OF GRAPHENE

(75) Inventors: James M. Tour, Bellaire, TX (US); Ayrat M. Dimiev, Houston, TX (US); Dmitry V. Kosynkin, Dhahran (SA)

(73) Assignee: William Marsh Rice University, Houston, TX (US)

( * ) Notice: Subject to any disclaimer, the term of this patent is extended or adjusted under 35 U.S.C. 154(b) by 27 days.

(21) Appl. No.: 13/878,876

(22) PCT Filed: Oct. 11, 2011

(86) PCT No.: PCT/US2011/055747
§ 371 (c)(1),
(2), (4) Date: Aug. 26, 2013

(87) PCT Pub. No.: WO2012/094045
PCT Pub. Date: Jul. 12, 2012

(65) Prior Publication Data
US 2013/0319973 A1 Dec. 5, 2013

Related U.S. Application Data

(60) Provisional application No. 61/391,936, filed on Oct. 11, 2010.

(51) Int. Cl.
*C03C 25/68* (2006.01)
*C01B 31/04* (2006.01)
*H01L 21/306* (2006.01)
*H01L 21/308* (2006.01)
*B82Y 30/00* (2011.01)
*B82Y 40/00* (2011.01)

(52) U.S. Cl.
CPC ......... *C01B 31/0484* (2013.01); *C01B 31/0438* (2013.01); *C01B 31/0469* (2013.01); *C01B 31/0476* (2013.01); *H01L 21/30604* (2013.01); *H01L 21/3085* (2013.01); *B82Y 30/00* (2013.01); *B82Y 40/00* (2013.01)

(58) Field of Classification Search
None
See application file for complete search history.

(56) References Cited

U.S. PATENT DOCUMENTS 7,297,626 B1   11/2007   Cole et al.
2010/0021708 A1   1/2010   Kong et al.

OTHER PUBLICATIONS

Lahiri, J. et al., "Graphene destruction by metal-carbide formation: an approach for patterning of metal-supported graphene." App. Phys. Lett, Jul. 13, 2010, 97, p. 023102-1-3.*

(Continued)

*Primary Examiner* — Allan Olsen
*Assistant Examiner* — Margaret D Klunk
(74) *Attorney, Agent, or Firm* — Winstead PC

(57) ABSTRACT

The present invention provides methods of selectively removing one or more graphene layers from a graphene material by: (1) applying a metal to a surface of the graphene material; and (2) applying a hydrogen containing solution to the surface of the graphene material that is associated with the metal. The hydrogen containing solution dissolves the metal along with one or more layers of graphene associated with the metal, thereby removing the layer(s) of graphene from the graphene material. In some embodiments, the hydrogen containing solution is an acidic solution, such as hydrochloric acid. In some embodiments, the metal is zinc. In some embodiments, the methods of the present invention are utilized to selectively remove one or more layers of graphene from one or more targeted sites on the surface of a graphene material.

22 Claims, 10 Drawing Sheets

(56) References Cited

OTHER PUBLICATIONS

Hinnen, C., "An in situ XPS study of sputter-deposited aluminium thin films on graphite", Applied Surface Science, 1994, vol. 78, pp. 219-231.

Reina, A., "Transferring and Identification of Single- and Few-Layer Graphene on Arbitrary Substrates", Journal of Physical Chemistry C. Nov. 2008, vol. 112, Issue 46; p. 17741.

International Searching Authority, "Notification of Transmittal of the International Search Report and the Written Opinion of the International Searching Authority, or the Declaration", Jun. 13, 2012, Application No. PCT/US2011/055747.

Geim, A.K.; Novoselov, K.S. "The rise of graphene." Nature Mater. 6, 183-191 (2007).

Novoselov, K.S. et. al. "Electric field effect in atomically thin carbon films." Science 306, 666-669 (2004).

Novoselov, K.S. et. al. Unconventional quantum Hall effect and Berry's phase of $2\pi$ in bilayer graphene. Nature Phys. 2, 177-180 (2006).

Gang, L. et. al. "Nanolithography of single-layer graphene oxide films by atomic force microscopy." Langmuir 26, 6164-6166 (2010).

Campos, L. C. et. al. "Anisotropic etching and nanoribbon formation in single-layer graphene." Nano Lett. 9, 2600-2604 (2009).

Gao, L. B. et al. "Crystallographic tailoring of graphene by nonmetal SiOx nanoparticles", J. Am. Chem. Soc. 131, 13934-13936 (2009).

Datta, S. S.; Strachan, D. R.; Khamis, S. M.; Johnson, A. T. C. "Crystallographic etching of few-layer graphene." Nano Lett. 8, 1912-1915 (2008).

Hummers, W.S.; Offeman, R.E. "Preparation of graphitic oxide." J. Am. Chem. Soc. 80, 1339 (1958).

Marcano, D. et al. "Improved synthesis of graphene oxide." ACS Nano 4, 4806-4814 (2010).

Kovtyukhova, N.I. et al. "Layer-by-layer assembly of ultrathin composite films from micron-sized graphite oxide sheets and polycations." Chem. Mater. 11, 771-778 (1999).

Stankovich, S. et al. "Synthesis of graphene-based nanosheets via chemical reduction of exfoliated graphite oxide." Carbon 45, 1558-1565 (2007).

Gomez-Navarro, C. et al. "Electronic transport properties of individual chemically reduced graphene oxide sheets." Nano Lett. 7, 3499-3503 (2007).

Tung, V.C.; Allen, M.J.; Yang, Y.; Kaner, R.B. "High-throughput solution processing of large-scale graphene." Nature Nanotech. 4, 25-29 (2009).

Mattevi, C. et al. "Evolution of electrical, chemical, and structural properties of transparent and conducting chemically derived graphene thin films." Adv. Func. Mater. 19, 2577-2583 (2009).

Li, X. et al. "Large-area synthesis of high-quality and uniform graphene films on copper foils." Science 324, 1312-1314 (2009).

Ferrari, A.C. et al. "Raman spectrum of graphene and graphene layers." Phys. Rev. Lett. 97, 187401-1-4 (2006).

Ferrari, A.C. "Raman spectroscopy of graphene and graphite: disorder, electron-phonon coupling, doping and nonadiabatic effects." Solid State Commun. 143, 47-57 (2007).

Lespade, P.; Marchand, A. "Characterisation de materiaux carbones par microspectrometrie Raman." Carbon 22, 375-385 (1984).

Poncharal, P., et al., ; "Raman spectra of misoriented bilayer graphene." Phys. Rev. B 78, 113407-1-4 (2008).

Hao, Y. et al. "Probing layer number and stacking order of few-layer graphene by Raman spectroscopy." Small 6, 195-200 (2010).

Unarunotai, S. et al. "Layer-by-layer transfer of multiple, large area sheets of graphene grown in multilayer stacks on a single SiC wafer." ACS Nano 10.1021/nn101896a, Sep. 15, 2010.

Chen, J.H. et al. "Diffusive charge transport in graphene on SiO2." Solid State Commun. 149, 1080-1086 (2009).

PCT International Bureau, International Preliminary Report on Patentability, Feb. 18, 2014, for PCT application No. PCT/US2011/055747.

* cited by examiner

LAYER-BY-LAYER REMOVAL OF GRAPHENE

CROSS REFERENCE TO RELATED APPLICATIONS

This application claims priority to U.S. Provisional Patent Application No. 61/391,936 filed on Oct. 11, 2010. The entirety of the above-referenced provisional application is incorporated herein by reference.

STATEMENT REGARDING FEDERALLY SPONSORED RESEARCH

This invention was made with government support under Air Force Office of Scientific Research Grant No. FA9550-09-1-0581, awarded by the U.S. Department of Defense; Air Force Research Laboratory Grant No. FA8650-05-D-5807, also awarded by the U.S. Department of Defense; and the Office of Naval Research Graphene MUR1 Program Grant No. N000014-09-1-1066, also awarded by the U.S. Department of Defense. The government has certain rights in the invention.

BACKGROUND OF THE INVENTION

The patterning of graphene is useful in fabricating electronic devices. However, existing methods do not allow for the control of the number of layers of graphene that can be removed during patterning. Therefore, a need exists for improved methods of patterning graphene.

BRIEF SUMMARY OF THE INVENTION

In some embodiments, the present invention provides methods of selectively removing one or more layers of graphene from a graphene material. Such methods generally include: (1) applying a metal to a surface of the graphene material; and (2) applying a hydrogen containing solution to the surface of the graphene material that is associated with the metal. Thereafter, the hydrogen containing solution dissolves the metal along with one or more layers of graphene associated with the metal. In some embodiments, the aforementioned method results in the removal of a single layer of graphene from the graphene material. In some embodiments, the method results in the selective removal of two or more layers of graphene from the graphene material. In further embodiments, the methods of the present invention may also include steps of rinsing and drying the graphene material after applying the hydrogen containing solution to the surface of the graphene material.

In some embodiments, the metal is applied to one or more targeted sites on the surface of the graphene material to result in the selective removal of graphene layers from those sites. In some embodiments, the metal is applied to the entire surface of the graphene material to result in the removal of one or more graphene layers from the entire surface.

In some embodiments, the graphene material is selected from the group consisting of graphene oxide, chemically converted graphene, partially reduced graphene oxide (also known as chemically converted graphene oxide), chemical vapor deposited graphene, micromechanically cleaved graphene, graphite, highly ordered pyrollitic graphite, graphite oxide, and combinations thereof. In some embodiments, the metal is applied to the surface of the graphene material by sputtering, thereby forming sputtered metal atoms on the surface of the graphene material. In some embodiments, the number of graphene layers removed from the graphene material is controlled by the sputtering power. For instance, in some embodiments, a certain sputtering power range removes a single layer of graphene from a graphene material. In other embodiments, a certain sputtering power range removes two layers of graphene from the graphene material.

In some embodiments, the metal is selected from the group consisting of Ni, Co, Fe, Pt, Au, Al, Ca, Cr, Cu, Mg, Mn, Mo, Rh, Si, Ta, Ti, W, U, V, Zr, and combinations thereof. In some embodiments, the metal has an oxidation potential greater than 0.5 Volts. In some embodiments, the hydrogen containing solution is selected from the group consisting of an acidic solution (e.g., hydrochloric acid), a basic solution (e.g., sodium hydroxide), a neutral solution, an aqueous solution, a non-aqueous solution (e.g., neat organic acid, ammonia, and alkylamines), and combinations thereof.

As set forth in more detail below, the methods of the present invention provide numerous advantages, including efficient methods of patterning graphene films by removing a single layer of graphene or its derivatives from a targeted site on a graphene material. As also set forth in more detail below, the methods of the present invention can find numerous applications in various fields, including the fabrication of electronic devices.

BRIEF DESCRIPTION OF THE FIGURES

FIG. 1A is a schematic illustration of the method, where (1) a bilayer graphene is placed on top of a $Si/SiO_2$ substrate; (2) a patterned layer of zinc metal is sputtered atop the graphene; (3) the zinc is removed by aqueous HCl (0.02 M) in 3-5 min with simultaneous removal of one graphene layer; (4) a second zinc stripe is patterned; and (5) HCl treatment removes the second stripe of zinc plus the underlying carbon layer. FIGS. 1B-1D show scanning electron microscopy (SEM) images of the bilayer GO flake. FIG. 1B is the original GO. FIG. 1C is the GO after the first Zn/HCl treatment. FIG. 1D is the GO after the second Zn/HCl treatment. FIG. 1E is an SEM image of a monolayer GO flake patterned in the image of an owl. FIGS. 1F and 1G show SEM images of a continuous GO film patterned with horizontal and vertical stripes in two consecutive Zn/HCl treatments. The lightest squares (an example is marked with "n−2"), where the horizontal and vertical stripes overlap, represent areas exposed to two treatments. Areas exposed to one treatment (examples are marked with "n−1"), are with a shade between the lightest and darkest squares. The darkest squares (examples are marked with "n") represent the areas with the original untreated GO film.

FIG. 2A is an SEM image. FIG. 2B is an atomic force microscopy (AFM) image. FIG. 2C shows height profiles of the original bilayer GO flake. FIGS. 2D-2F show corresponding images and height profiles for the same flake after the first Zn/HCl treatment. FIGS. 2G-2H show images and height profiles of the same flake after the second treatment. Height profiles 1-6 on panels (C), (F), and (I) are taken across the correspondingly numbered lines indicated on (B), (E), and (H). The blue arrows on the height profiles (C), (F), and (I) indicate the flake's boundaries. All the horizontal scale bars are 10 μm.

FIG. 3A shows Raman spectra of a bilayer CVD graphene film (top) as fabricated by stacking two monolayer (bottom spectrum) graphene films. The two spectra are scaled to have the same 2D peak height. The Raman spectra here and in FIG. 3C were taken with 514 nm laser excitation. FIG. 3B is an SEM image of a bilayer CVD graphene film patterned by horizontal stripes in one Zn/HCl treatment. The yellow numbers indicate the number of carbon layers present after the treatment. FIG. 3C shows Raman spectra of the bilayer graphene film exposed to one Zn/HCl treatment (marked with "1"). FIG. 3D shows two I(V) curves measured for the same device: the as-fabricated bilayer graphene (black line), and after exposing it to one Zn/HCl treatment (red line).

FIG. 4A shows a transmission electron microscopy (TEM) image of monolayer CVD graphene sputter-coated with 0.6 nm zinc. Dark, 1 to 3 nm-sized zinc clusters are visible on the graphene surface. FIG. 4B shows an SEM image of a GO flake on a Si/SiO$_2$ wafer sputter-coated with 0.6 nm zinc. Zinc clusters appear on the wafer surface but no clustering is observed on the GO surface. FIG. 4C shows Raman spectra. FIGS. 4D-E show C1s XPS spectra of monolayer CVD graphene on a Si/SiO$_2$ wafer sputter-coated with 0.6 nm of four different metals: zinc, aluminum, gold and copper. In FIG. 4D, black line=original graphene; blue=aluminum-coated; red=zinc-coated. In FIG. 4E, black line=original graphene; dark cyan=copper-coated; magenta=gold-coated.

FIGS. 5A-B show AFM images and height profiles for the original micromechanically cleaved graphene flake. FIGS. 5C-D show the same flake after one Zn/HCl treatment. FIGS. 5E-F show the same flake after three more sequential Zn/HCl treatments. The two AFM images on each of the three panels (A, C, and F) are taken in "height" mode (left), and in "amplitude" mode (right). Height profiles 1-6 (panels B, D, and F) are taken across the correspondingly numbered lines indicated on AFM images A, C, and E. Scale bars on height profiles: vertical is 5 nm and horizontal is 1 µm; the blue arrows on height profiles 1-6 (panels B, D, and F) indicate the flake's boundaries.

FIGS. 6A-6D show AFM images and height profiles for the original flake. FIGS. 6E-6H show AFM images and height profiles for the same flake after three consecutive Zn/HCl treatments. The two AFM images on panels (A) and (E) are taken in "height" mode (left), and in "amplitude" mode (right). Height profiles (B to D) and (F to G) are taken across the lines labeled with corresponding numbers 1-6; all the horizontal scale bars on height profiles are 500 nm. Blue arrows on height profiles (F, G, and H) indicate the flake's boundaries. In addition, the Zn/HCl technique was used to remove three carbon layers from HOPG. The three sequential treatments afforded a 1.3-nm height difference between the treated and untreated areas.

FIG. 9A shows a GO flake exposed to one treatment by Al/NaOH. FIG. 9B shows the C1s XPS spectrum of a GO film after exposure to one Zn/HCl treatment. FIG. 9C shows an SEM image of residue left on a GO flake after removing one layer. The yellow dashed line indicates the border line between treated (bottom-right) and untreated (top-left) areas. FIG. 9D shows a TEM image of residue remaining on a GO flake after removing one layer. The inset in FIG. 9D is the higher magnification of a piece of residue; the scale bar in the inset is 100 nm.

DETAILED DESCRIPTION OF EXEMPLARY EMBODIMENTS

Figure 1:
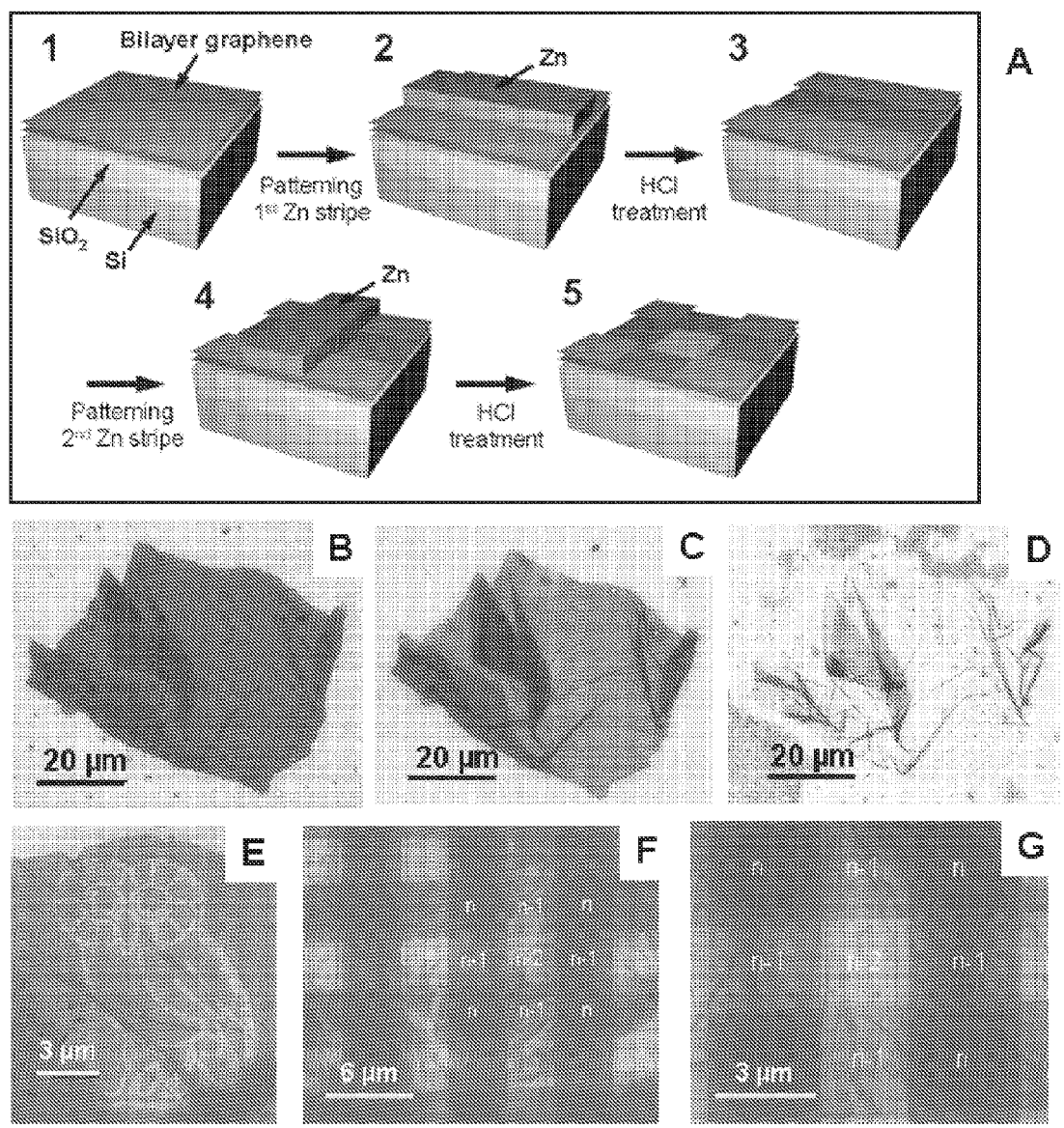
FIG. 1 illustrates the controlled layer-by-layer removal of graphene from a graphene oxide (GO) flake material.

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise.

The section headings used herein are for organizational purposes only and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

The electronic properties of graphene, a two dimensional network of sp$^2$ carbon atoms, can vary as a function of the number of carbon layers in the sample. Existing methods for patterning graphene do not allow one to control the number of layers removed. Some of these techniques are designed to work with a single existing layer of carbon material. Other methods that were applied toward few-layer graphene (FLG) indiscriminately etch all of the layers present in the sample down to the supporting substrate. Therefore, a need exists for improved methods of removing graphene layers from graphene materials in a more precise manner.

The present invention provides methods of removing a single graphene layer from a graphene material. Such methods generally include: (1) applying a metal to a surface of the graphene material; and (2) applying a hydrogen containing solution to the surface of the graphene material that is associated with the metal. Thereafter, the hydrogen containing solution dissolves the metal along with one or more layers of graphene or its derivatives (hereinafter "graphene layer" or "one or more layers of graphene") that are associated with the metal. This results in the selective removal of the one or more graphene layers from the graphene material.

In some embodiments, one or more graphene layers are selectively removed from a graphene material by applying a metal to one or more targeted sites on the graphene material. This results in the selective removal of one or more graphene layers from those sites upon treatment with a hydrogen containing solution.

In some embodiments, the methods of the present invention also include steps of rinsing and drying the graphene material after the removal of the one or more graphene layers. In some embodiments, the method may be repeated multiple times as sequential or simultaneous steps in order to remove multiple graphene layers from a graphene material. In some embodiments, the method may be used to remove a single layer of graphene. In some embodiments, the method may be used to remove multiple layers of graphene at the same time.

FIG. 1A provides a schematic of an exemplary and non-limiting method of removing single graphene layers from a graphene material (in this case, graphene oxide surface). In this method, a bilayer graphene oxide is placed on top of a Si/SiO$_2$ substrate. Next, a patterned layer of zinc metal is sputtered on top of the graphene. The zinc layer is then removed by aqueous HCl, which results in the simultaneous removal of one graphene layer. Next, a second zinc metal layer is sputtered on top of the graphene oxide surface at a direction that is perpendicular to the first zinc metal layer. The zinc layer and the underlying graphene layer are then removed by a second HCl treatment. This results in the formation of the patterned graphene oxide surface shown in FIG. 1A.

Reference will now be made to more specific and non-limiting embodiments of the present invention.

Graphene Materials

The methods of the present invention may be used to treat or pattern numerous graphene materials. Graphene materials generally refer to materials that contain graphenes, graphene derivatives, and combinations thereof. Non-limiting examples of graphene materials that could be patterned include, without limitation, graphene oxide (GO), chemically converted graphene (CCG), partially reduced graphene oxide (RGO, also known as chemically converted graphene oxide), chemical vapor deposited (CVD) graphene, micromechanically cleaved graphene (also known as "scotch-tape" graphene), graphene grown from solid carbon sources, graphite, highly ordered pyrollitic graphite (HOPG), graphite oxide and combinations thereof.

The graphene materials treated or patterned in accordance with the methods of the present invention may have numerous layers. In some embodiments, the graphene material has one layer. In some embodiments, the graphene material may have multiple layers, such bilayers and trilayers. In some embodiments, the graphene material is a few layer graphene (FLG).

In some embodiments, the graphene materials to be treated have non-patterned surfaces. In some embodiments, the pre-treated graphene materials may have patterned surfaces.

The graphene materials to be treated may also be placed on various substrates before treatment. Exemplary substrates include, without limitation, silicon (Si), silicon oxide (SiO$_2$), SiO$_2$/Si, silicon nitride (Si$_3$N$_4$), hexagonal boron nitride (h-BN), sapphire (Al$_2$O$_3$), and combinations thereof. In some embodiments, the substrate is a Si/SiO$_2$ substrate.

Application of Metals to Graphene Surfaces

Various metals may be applied to graphene surfaces in order to facilitate the removal of a graphene layer. In some embodiments, the metal is zinc. In some embodiments, the metal is aluminum. In some embodiments, the metal is magnesium. In some embodiments, the metal is at least one of Ni, Co, Fe, Pt, Au, Al, Ca, Cr, Cu, Mg, Mn, Mo, Rh, Si, Ta, Ti, W, U, V, Zr and combinations thereof. In some embodiments, the metal is a metal that is capable of forming atomic hydrogen upon addition of an acid or base. In some embodiments, the metal has an oxidation potential greater than 0.5 Volts.

The metals used with the methods of the present invention can also have various shapes, sizes, and thicknesses. For instance, in some embodiments, the metals of the present invention may be in the form of a cube, rectangle or cylinder. In some embodiments, the metals of the present invention may be in sputtered form. In some embodiments, the metals of the present invention may have a uniform structure. In some embodiments, the metals of the present invention may be patterned. In some embodiments, the metals of the present invention may have a thickness that ranges from about 1 atom to about 4 atoms. In some embodiments, the metals of the present invention have a thickness of about 1 atom.

Various methods may also be used to apply metals to graphene surfaces. In some embodiments, the metal is applied to the surface of the graphene material by methods such as thermal evaporation, electron beam evaporation, sputtering, film pressing, film rolling, printing, ink jet printing, gravure printing, compression, vacuum compression, and combinations thereof.

In more specific embodiments, the metal is applied to the surface of the graphene material by sputtering. In some embodiments, the sputtering results in the formation of sputtered metal atoms on the surface of the graphene material. Sputtering metals is often a facile method of metal deposition. In some instances, sputtering the metal can give the metal atoms high enough energy to partially damage the first layer of graphene, thereby facilitating graphene layer removal.

In some embodiments, the number of graphene layers removed from the graphene material is controlled by the sputtering power. For instance, in some embodiments, a certain sputtering power range removes a single layer of graphene from a graphene material. In some embodiments, such sputtering power range is from about 10 Watts to about 20 Watts. In other embodiments, a certain sputtering power range removes two layers of graphene from the graphene material. In some embodiments, such sputtering power range is from about 40 Watts to about 50 Watts.

Metals may be applied to various areas of a graphene material surface. In some embodiments, the metal is applied to one or more targeted sites on a surface of a graphene material. This can result in the selective removal of one or more graphene layers only from the targeted sites. In some embodiments, the metal is applied to the entire surface of a graphene material. This in turn can result in the removal of one or more graphene layers from the entire surface of the graphene material.

Application of Hydrogen Containing Solutions to Graphene Surfaces

Various hydrogen containing solutions may be used to remove one or more graphene layers from a surface of a graphene material that is covered with a metal. In some embodiments, the hydrogen containing solution is selected from the group consisting of an acidic solution (e.g., hydrochloric acid), a basic solution (e.g., sodium hydroxide), a neutral solution, an aqueous solution, a non-aqueous solution (e.g., neat organic acids, ammonia, and alkylamines), and combinations thereof.

In some embodiments, the hydrogen containing solution is an acidic solution. Non-limiting examples of acidic solutions include solutions containing sulfuric acid (H$_2$SO$_4$), fluorosulfuric acid (HSO$_3$F), nitric acid (HNO$_3$), phosphoric acid (H$_3$PO$_4$), fluoroantimonic acid (HSbF$_6$), fluoroboric acid (HBF$_4$), hexafluorophosphoric acid (HPF$_6$), chromic acid (H$_2$CrO$_4$), boric acid (H$_3$BO$_3$), acetic acid (CH$_3$COOH), citric acid (C$_6$H$_8$O$_7$), formic acid (HCOOH), gluconic acid (HOCH$_2$—(CHOH)$_4$—COOH), lactic acid (CH$_3$—CHOH—COOH), oxalic acid (HOOC—COOH), tartaric acid (HOOC—CHOH—CHOH—COOH), hydrochloric acid (HCl), hydrofluoric acid (HF), hydrobromic acid (HBr), hydroiodic acid (HI), hypochlorous acid (HClO), chlorous acid (HClO$_2$), chloric acid (HClO$_3$), perchloric acid (HClO$_4$), and combinations thereof. In more specific embodiments, the acidic solution is HCl.

In some embodiments, the hydrogen containing solution is a basic solution. Non-limiting examples of basic solutions include solutions containing sodium hydroxide (NaOH), potassium hydroxide (KOH), barium hydroxide (Ba(OH)$_2$), caesium hydroxide (CsOH), strontium hydroxide (Sr(OH)$_2$), calcium hydroxide (Ca(OH)$_2$), magnesium hydroxide (Mg(OH)$_2$), lithium hydroxide (LiOH), rubidium hydroxide (RbOH), and combinations thereof. In some embodiments, the basic solution is NaOH.

In additional embodiments, the application of hydrogen containing solutions to graphene surfaces may also be followed by a rinsing step, a drying step, or both steps. In some embodiments, the treated graphene material may be rinsed with an aqueous solution. In some embodiments, the treated and rinsed graphene material may then be dried in an inert environment. In some embodiments, the inert environment is under the continuous flow of an inert gas, such as H$_2$, N$_2$, Ar, and combinations thereof.

Advantages and Applications

The methods of the present invention provide numerous advantages. For instance, the methods of the present invention may be used to create graphene materials with patterned surfaces that have single layers of graphene removed from one or more targeted sites. In some embodiments, the graphene layers on the graphene material that are not removed (i.e., not associated with metals) remain intact (or substantially intact) after the removal of graphene layers (i.e., graphene layers associated with metals).

The patterned graphene materials formed by the methods of the present invention can have numerous applications in various fields. For instance, in some embodiments, the patterned graphene materials may be used in various electronic devices. In some embodiments, the electronic devices can be used for new designs of electrical or optoelectronic circuits.

Figure 10:
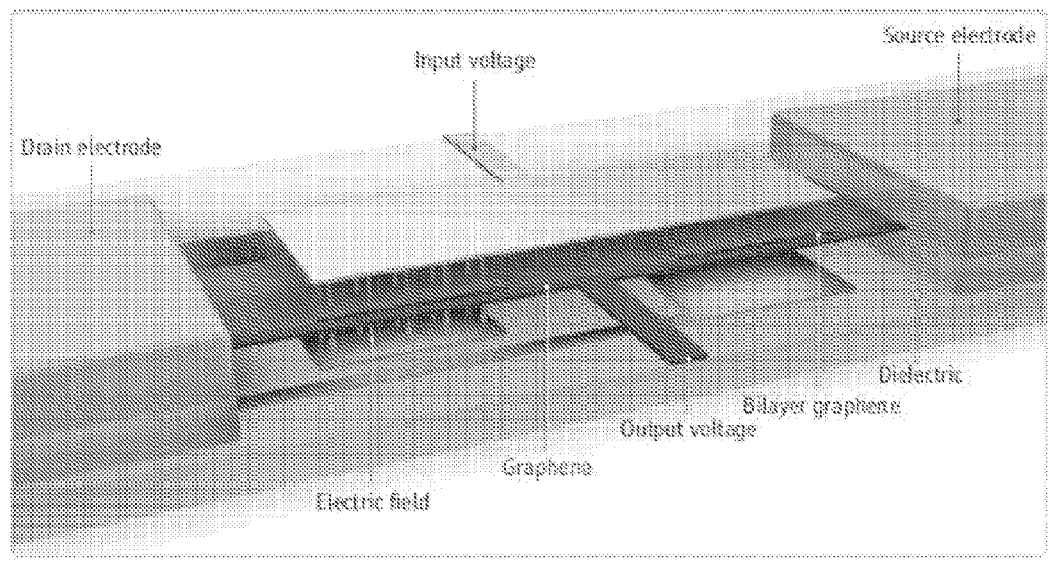
FIG. 10 shows a graphene device that utilizes patterned graphene materials in accordance with various embodiments of the present invention.

FIG. 10 shows an electronic device that utilizes graphene materials formed in accordance with the methods of the present invention. The central black layer contains regions of monolayer and bilayer graphene and is insulated with a dielectric from the top and bottom gate electrodes. Application of an input voltage to the top gate that matches that of the drain (or source) electrode would generate an electric field in the left (or right) bilayer graphene region. The electric field suppresses conduction, leading to an output voltage matching that of the source (or drain) electrode, effectively inverting the input voltage. Such a device could be fabricated by depositing a Bernal-stacked bilayer of graphene onto existing electrodes and then peeling some areas away to form monolayers. The bilayer graphene regions in the center are transistors that ideally conduct only in the absence of a vertical electric field.

Vertical electric fields in the bilayer regions are controlled by gate electrodes in the top and bottom layers of the device that are electrically insulated from the central layer. Monolayer graphene, which remains an excellent conductor in the presence of these fields, is an ideal lead material to the source and drain electrodes. In some embodiments, the device shown in FIG. 10 could be truly "all carbon" by making both the top and bottom gates from graphene. Moreover, insulating forms of graphene generated through fluorination could serve as thin and effective gate dielectrics.

In sum, the device shown in FIG. 10 illustrates one of many new structures more readily achieved by utilizing the methods of the present invention. Moreover, the lateral resolution of the technique is ripe for exploration, given the desire for ever smaller electronic devices. Ultimately, the ability to peel just a single layer of graphene from a desired area with such a simple and robust technique is exceedingly useful.

Additional Embodiments

Reference will now be made to more specific embodiments of the present disclosure and experimental results that provide support for such embodiments. However, Applicants note that the disclosure below is for exemplary purposes only and is not intended to limit the scope of the claimed invention in any way.

Additional details about the experimental aspects of the above-described studies are discussed in the subsections below. In the Examples below, Applicants demonstrate that sputter-coating graphene and graphene-like materials with various metals, and dissolving the latter with acidic or basic solutions, removes one graphene layer and leaves the lower layers intact. The method works with the four different types of graphene and graphene-like materials: graphene oxide (GO), chemically converted graphene (CCG), chemical vapor deposited (CVD) graphene, and micromechanically cleaved ("Scotch-tape") graphene. Based on Applicants' data, the top graphene layer is damaged by the sputtering process and the acid or basic treatment removes the damaged layer of carbon. When used with predesigned metal patterns, this method can be viewed as lithography that etches the sample with single-atomic-layer resolution.

EXAMPLE 1

Patterning of Graphene by Zinc and HCl

In a typical single-atomic layer lithography procedure (FIG. 1A), Applicants coated graphene that was supported on a Si/SiO$_2$ wafer with 5 nm of zinc metal by sputtering. The sample was then placed in dilute HCl solution (typically 0.02 to 0.1 M) for 3 to 5 min to dissolve the zinc. Finally, the sample was rinsed with water and dried in a stream of nitrogen. This series of steps removes one layer of graphene, and the procedure can be repeated to remove additional graphene layers. For patterning of few layer graphene (FLG), zinc was deposited on the targeted areas only, thus removing a carbon layer strictly from those zinc-coated areas.

The method was used initially on GO and CCG. The GO was prepared according to the Hummers method (*J. Am. Chem. Soc.* 80, 1339 (1958)), modified as described previously (*ACS Nano* 4, 4806-4814 (2010)). The effect of treatment of the same GO flake in the course of two consecutive treatments is shown in FIGS. 1B-D. The SEM image of the original flake (FIG. 1B) is dark, and the features are barely visible. The flake appears semi-transparent after the first treatment (FIG. 1C), and almost completely transparent after the second treatment (FIG. 1D). The flake's wrinkles and folded areas, which survived after the second treatment (FIG. 1D), show the outline of the original flake.

A similar set of SEM images is shown for patterned GO samples (FIGS. 1E-1G). The owl image on the GO flake that was e-beam patterned and Zn/HCl treated (FIG. 1E) shows that one GO layer can be removed in one treatment. FIGS. 1F-1G show different fragments of a continuous few-layered GO film atop a Si/SiO$_2$ substrate. The samples were first exposed to one Zn/HCl treatment in the shape of horizontal stripes, and then to one more treatment in the shape of vertical stripes, as shown in schematic FIG. 1A. The treated areas appear lighter in the SEM when compared to the untreated areas, and the GO film acquires a transparent appearance. The underlying flakes are not removed from the treated areas. The lower layer flakes that extend from the treated areas through the untreated areas are clearly visible. Note that even in the areas exposed to two treatments where horizontal and vertical stripes overlap (marked with "n−2" on FIGS. 2F-2G), the number of remaining layers is not zero. The lower layers that remain are visible in the areas where the original film contained three or more GO layers.

Figure 2:
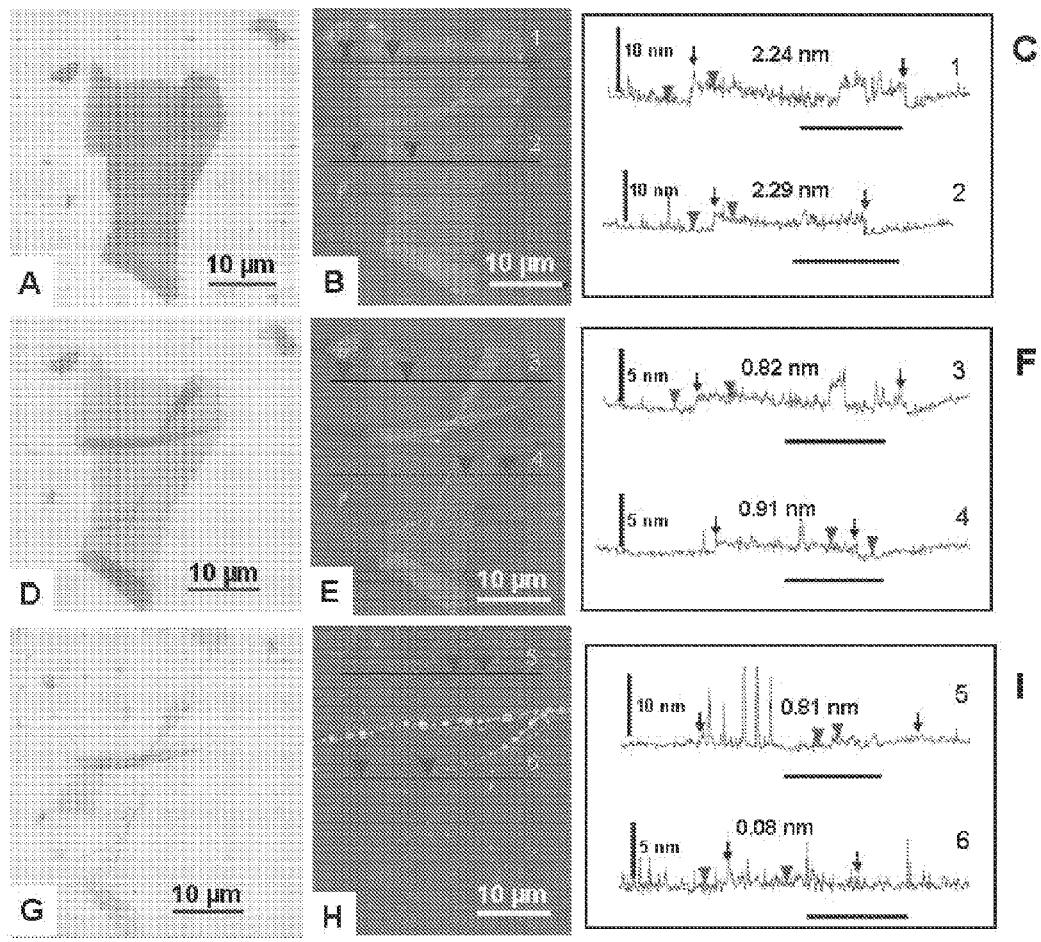
FIG. 2 is a bilayer GO flake in the course of two consecutive treatments.

In order to determine the number of carbon layers removed, we supplemented SEM images with AFM analysis, which in this case is a sensitive tool because of the large interlayer distance in the GO samples. FIG. 2 shows a GO flake during the course of two consecutive Zn/HCl treatments. The SEM image of the original flake (FIG. 2A) was dark, while the AFM image (FIG. 2B) was well-pronounced. The thickness of the flake's main body (FIG. 2C) was 2.2 to 2.3 nm, which corresponds to two carbon layers of highly oxidized GO. After the first Zn/HCl treatment the flake became semi-transparent in the SEM image (FIG. 2D), and the wrinkles and folded areas were clearly visible. The AFM image (FIG. 2E) indicated a smaller height difference. The thickness was 0.8 to 0.9 nm (FIG. 2F), which corresponds to one layer of reduced GO, or namely CCG. After the second Zn/HCl treatment (FIGS. 2G-2H) the flake disappeared, and the wrinkles and folded areas were the only parts still observable. The height profiles (FIG. 2I) were flat, suggesting that no layered carbon material was left on the surface except at the former folded regions. The sharp peaks in the height profiles 5 and 6 are caused by particulate contamination. These SEM and AFM images along with the height profiles show that two layers of the bilayer GO flake are sequentially and controllably removed during two consecutive Zn/HCl treatments.

Figure 3:
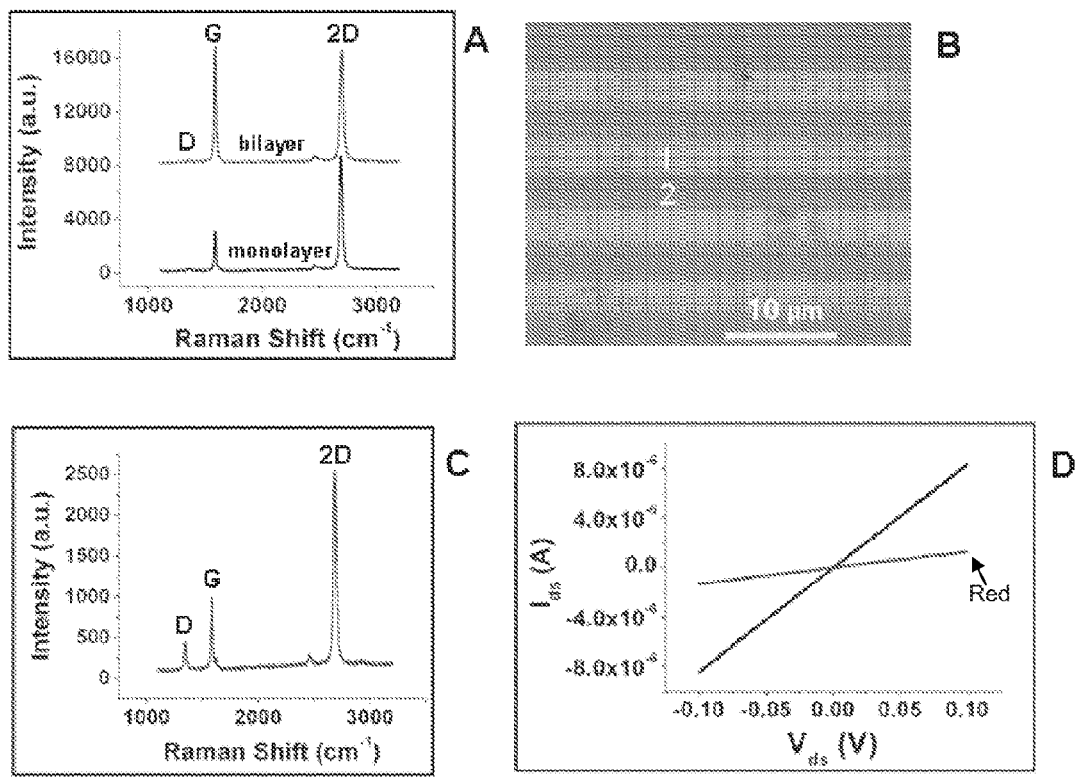
FIG. 3 illustrates the removal of a carbon layer from chemical vapor deposited (CVD) graphene material.

Next, Applicants applied the method toward CVD graphene (FIG. 3), which was grown on copper and transferred to a Si/SiO$_2$ substrate. Bilayer CVD graphene was fabricated by stacking two independently grown monolayer graphene films. As has been shown, Raman spectroscopy can be used as a sensitive tool to determine the number of graphene layers. FIG. 3A is the Raman spectrum of the bilayer graphene film fabricated by stacking two monolayer sheets. The spectrum for the monolayer is taken from the areas where the two precursor sheets do not overlap, and thus it keeps its monolayer identity. The two spectra in FIG. 3A were normalized, to bring the 2D peaks to the same height. The following changes occurred in the Raman spectrum as the second graphene layer was added: the G-band dramatically increased in intensity and slightly red-shifted. A blue shift of 10 cm$^{-1}$ was observed for the 2D-band, with some increase of full width half maximum (FWHM) value. Without being bound by theory, these characteristics are indicative of the change in the electron bands caused by the interactions of the graphene layers, and are consistent with the presence of misoriented bilayer graphene. The relative intensities of the G and 2D peaks are distinct for the two spectra, and consistent with earlier reports.

The as-fabricated bilayer graphene film was patterned with horizontal stripes in one Zn/HCl treatment (FIG. 1B). In the areas where the top layer was selectively removed, the Raman spectrum shows the presence of monolayer graphene only. The increase in D-band intensity (FIG. 3C vs. FIG. 3A bottom) indicates slight disruption of the remaining layer or it might be caused by residual stripped carbon impurities.

In addition to Raman spectral analysis, the electrical properties of devices fabricated on a bilayer CVD-graphene film were measured before and after the Zn/HCl treatment. The channel width was 3 μm and the channel length was 10 μm. For 60 devices measured, the conductivity decreased 2 to 10 times after removing of one layer from an original bilayer device. The current-voltage [I(V)] curves before (black) and after the treatment (red) are shown in FIG. 3D for one of the devices where conductivity decreased by a factor of 6 after the treatment, which is an average for the series of experiments. The conductivity of bilayer graphene has been shown to be 4 to 10 times higher than that for monolayer graphene because of the interaction of the bottom layer with the SiO$_2$ substrate. Moreover, the 2 to 10 range that we recorded is not likely to be associated with the reproducibility of the Zn/HCl treatment method, but with inherent differences in the original graphene samples, such as mismatched interaction between graphene layers and corrugations between the layers. We find similar inconsistencies in electrical properties of as-grown monolayer CVD-graphene itself wherein devices fabricated on the same monolayer graphene film but separated by just 5 μm show differences in conductivities in this same range.

Figure 5:
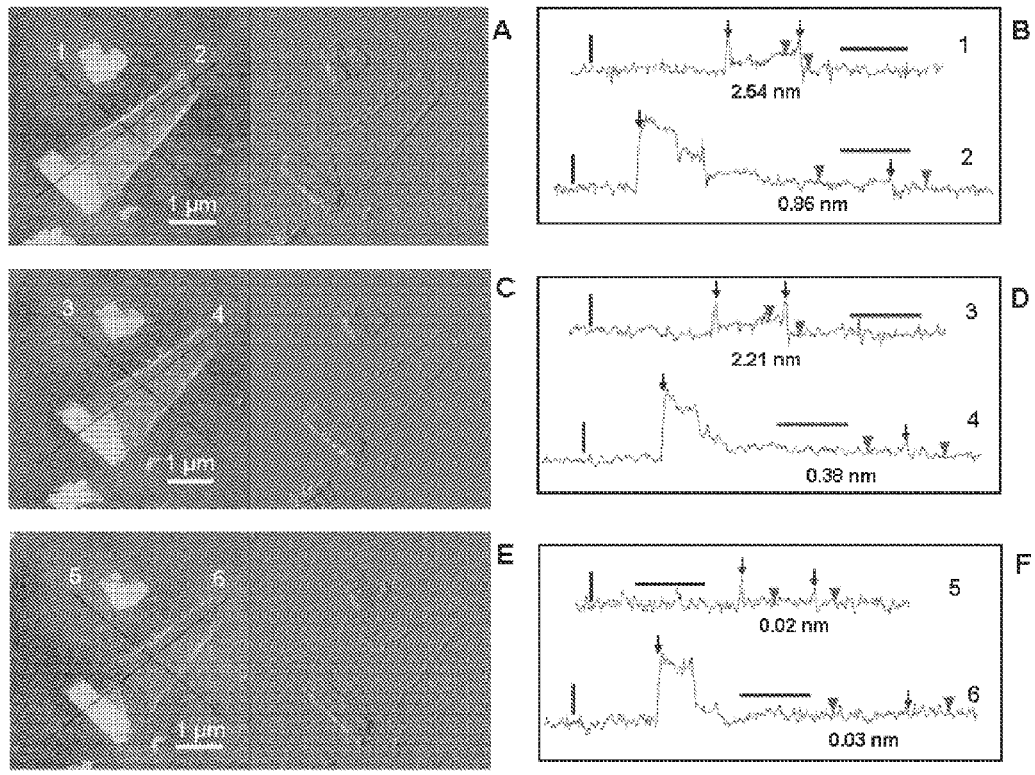
FIG. 5 shows data relating to the removal of carbon layers from a micromechanically cleaved graphene.
Figure 6:
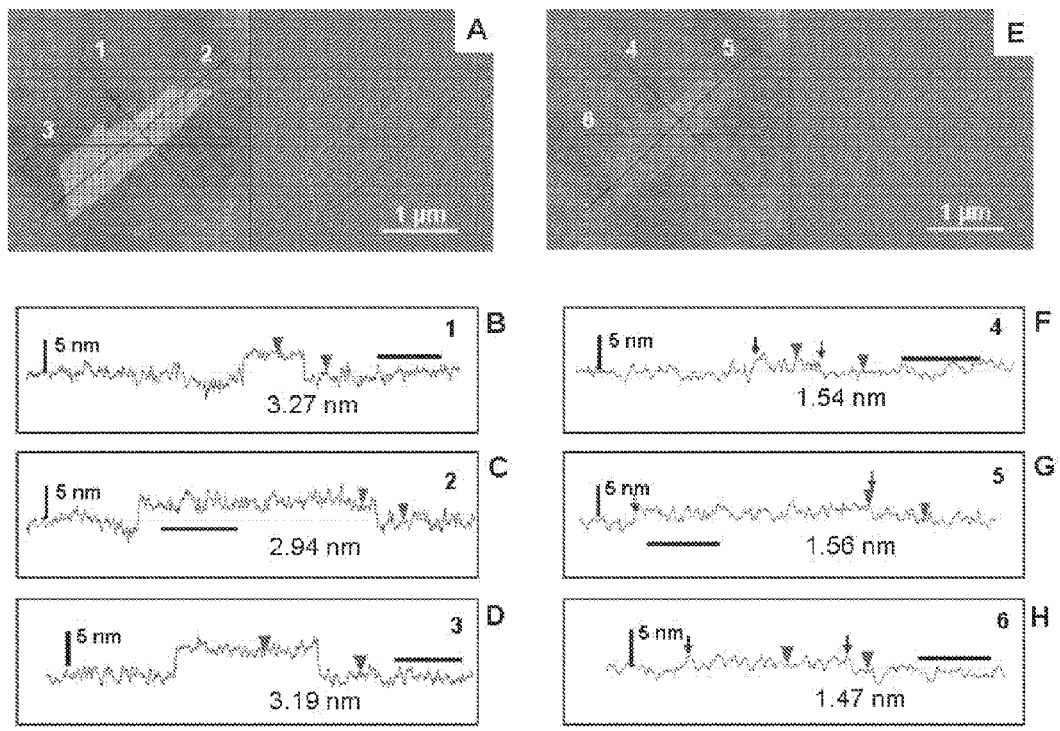
FIG. 6 shows data relating to the removal of carbon layers from a micromechanically cleaved few layer graphene (FLG) flake.

Finally, the graphene layer removal method was effective when applied to few-layer micromechanically cleaved graphene and highly ordered pyrolytic graphite (HOPG). As shown in FIGS. 5 and 6, the Zn/HCl protocol can be used to sequentially remove layer after layer of the "Scotch tape" derived graphene.

In order to probe the mechanism of the reaction, in a control experiment we deposited zinc metal on CVD graphene by thermal evaporation instead of sputtering. No change in the graphene structure was observed after treatment with HCl. However, a carbon layer was successfully removed from GO and CVD graphene by sputter-coating 5 nm of aluminum and dissolving the latter in either 0.1 M HCl or in concentrated aqueous NaOH. Thus, a key factor in removing the carbon layer in graphene is the sputtering process, which forms defects in the top layer, allowing its further removal. Sputtered metal atoms have about 100 times more energy than those produced by thermal evaporation. It has been shown that irradiation of graphite by low energy ion beams produces atomic-size defects that do not extend further than the top layer. The threshold energy for carbon atom displacement has theoretical estimates of 18 to 22 eV and experimental values of 18 to 20 eV for e-beam irradiation. At the same time, the corresponding experimental energy values for ion irradiation are >30 eV with the most frequently reported being 31 to 34.5 eV. These values are ion dependent, and the values for Ar$^+$ and Kr$^+$ are 47.3 eV and 80.8 eV, respectively, to yield one-carbon atom vacancy defects. There are no reports of threshold energies for metal atoms needed to form similar defects. The average energy for sputtered metal atoms, including zinc, is 0.5 to 3 eV. For zinc, the percentage of atoms having 20 eV and 34 eV is only 0.8% and 0.5%, respectively; hence only a small number of the sputtered atoms will have sufficient energy for carbon-atom displacement in the graphene. However, the ability to form defects is not solely a function of the incident particle energy, but it also depends on its chemical identity.

EXAMPLE 2

Patterning of Graphene by Zinc, Aluminum, Gold and Copper

Figure 4:
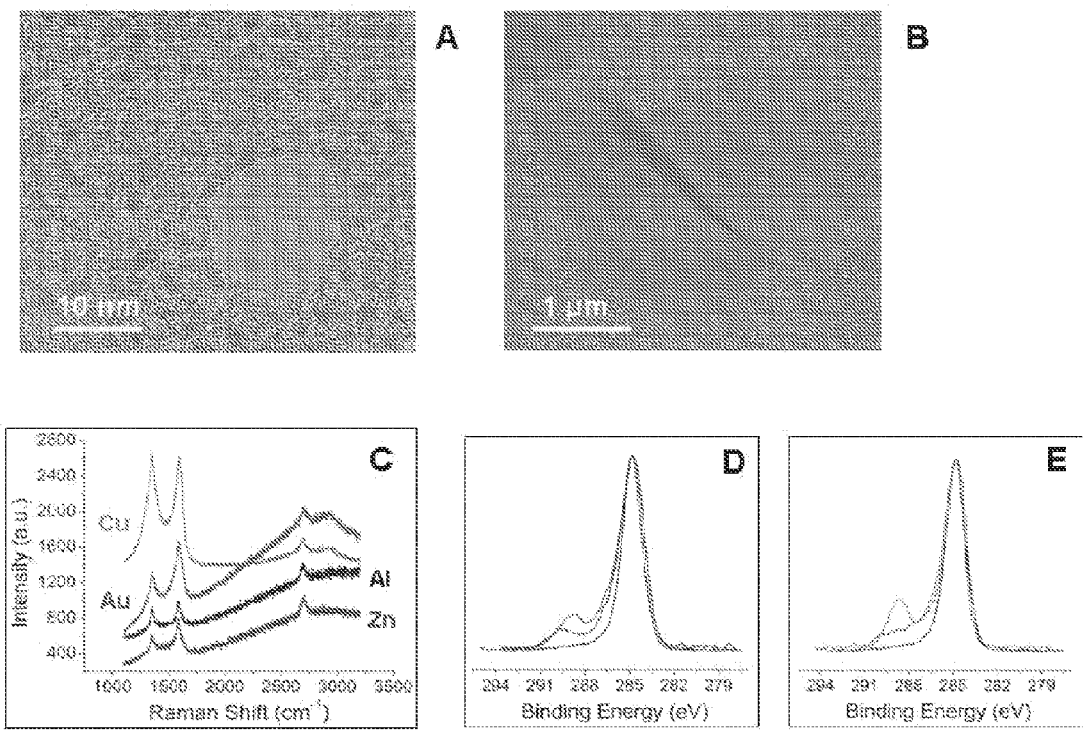
FIG. 4 provides an analysis of metal-sputtered graphene samples.

To further investigate the effect of sputtering on graphene, Applicants separately sputter-coated CVD graphene and GO samples with as little as 0.6 nm of zinc, aluminum, copper or gold, followed by analysis of the sputtered products before dissolving the metals. Assuming a densely packed and uniform coating, 0.6 nm should provide a 3 to 4-atom thick layer of metal atop of graphene. FIG. 4A is a TEM image of CVD graphene suspended on a grid after sputter-coating with 0.6 nm of zinc. While sputtering forms some holes in the graphene, the larger part of the carbon network is not broken. The graphene sheet not only remained suspended on the grid, but also supported the zinc clusters. However, the effect of sputtering onto graphene atop an SiO$_2$ surface might be different from graphene suspended on a grid. Zinc atoms, sputtered atop GO samples on a Si/SiO$_2$ substrate under the same conditions do not form discernible clusters in the SEM (FIG. 4B). The zinc nanoparticles are clearly visible on the Si/SiO$_2$ substrate surface but not on the GO flake. The zinc atoms likely form chemical bonds with the oxygen functionalities of the GO, thus preventing the agglomeration of the zinc.

Raman spectra of the sputter-coated CVD graphene samples (FIG. 4C) have the features of amorphous carbon, suggesting that the graphene conjugation has been severely disrupted. The C1s X-ray photoelectron spectroscopy (XPS) data (FIGS. 4D-E) also exhibit noticeable changes in comparison with untreated graphene. The main carbon peak at 284.8 eV broadens and a small carbonyl group signal appears at 288.0 to 289.0 eV. The main peak broadening is consistent with the presence of sp$^3$-hybridized carbon in addition to sp$^2$-hybridized carbon, suggesting a significant transformation in the structure. The presence of carbonyl groups provides evidence for the formation of vacancy defects because carbonyl groups can exist only at the edges of graphene. The effect of different metals on the XPS spectrum is apparent. Gold and copper cause less main peak broadening, but they introduce oxygen functionalities as evidenced by the shoulder in the 286.0 to 289.0 eV region for gold, and the well-pronounced C=O peak at 288.6 eV for copper. Aluminum deposition leads to broadening of the main carbon peak, as does zinc, but aluminum does not afford as many carbonyls. Finally, zinc sputtering causes both the main peak to broaden and oxidizes graphene to produce carbonyl groups. The oxidation can be explained by reaction of the carbon radicals at the newly formed defect sites with traces of oxygen present in the sputtering chamber (5×10$^{-5}$ Torr) or upon subsequent exposure to air. The XPS data indicate that zinc sputtering, among the four tested metals, most affects the graphene as seen by the broadening of the main C1s signal. Interestingly, GO samples sputter-coated with metals behave somewhat differently than do CVD graphene samples, but both form similar materials characterized by defective carbon layers with a significant content of carbonyl groups; the results of those experiments are in the SOM (3.0) and FIG. 7.

Without being bound by theory, it is envisioned that sputtering damages graphene but does not remove it. Dissolving the zinc in acid is an important step in removing the graphene layer. To investigate the role of the dissolving agent, Applicants treated sputtered metals with different solutions. It was found that the carbon layer was removed when dissolving sputtered zinc using HCl or when dissolving sputtered aluminum using either HCl or concentrated NaOH. In all of those mixtures, H$_2$ gas is evolved. Conversely, no carbon layer was removed when dissolving sputtered copper in HCl/CuCl$_2$ or when dissolving sputtered gold in KI/I$_2$ (no gas is evolved in those metal dissolutions). While gas evolution may play a role in the carbon layer removal, a further difference of the two carbon-stripping metals, zinc and aluminum, versus the non-carbon-stripping metals, copper and gold, is in their oxidation potentials. The combination of top-layer hole-formation in the graphene, the large oxidation potentials of zinc and aluminum as well as the evolved gas during their dissolution, all likely contribute to the mechanistic efficacy of the process.

Figure 8:
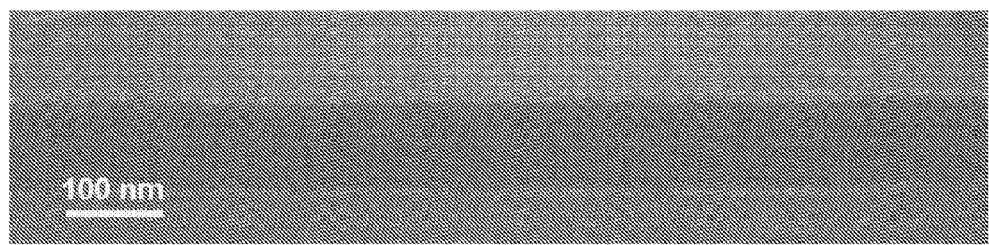
FIG. 8 shows an SEM image of a 100-nm-wide graphene-removal made in CVD graphene by Zn/HCl treatment.

The resolution that should be obtainable from this technique is being primarily dictated by the resolution of the metal patterning method. A 100-nm-wide zinc line was formed atop graphene with e-beam lithography and a commensurately sized removal of the carbon layer was afforded by treatment with HCl (FIG. 8). Furthermore, based on AFM data, no delamination on the fabricated pattern corners or edges was observed while removing carbon layers from GO or HOPG. Over larger areas, scrolling of the edges was never observed by SEM.

EXAMPLE 3

Patterning of Graphene Oxide

Figure 9:
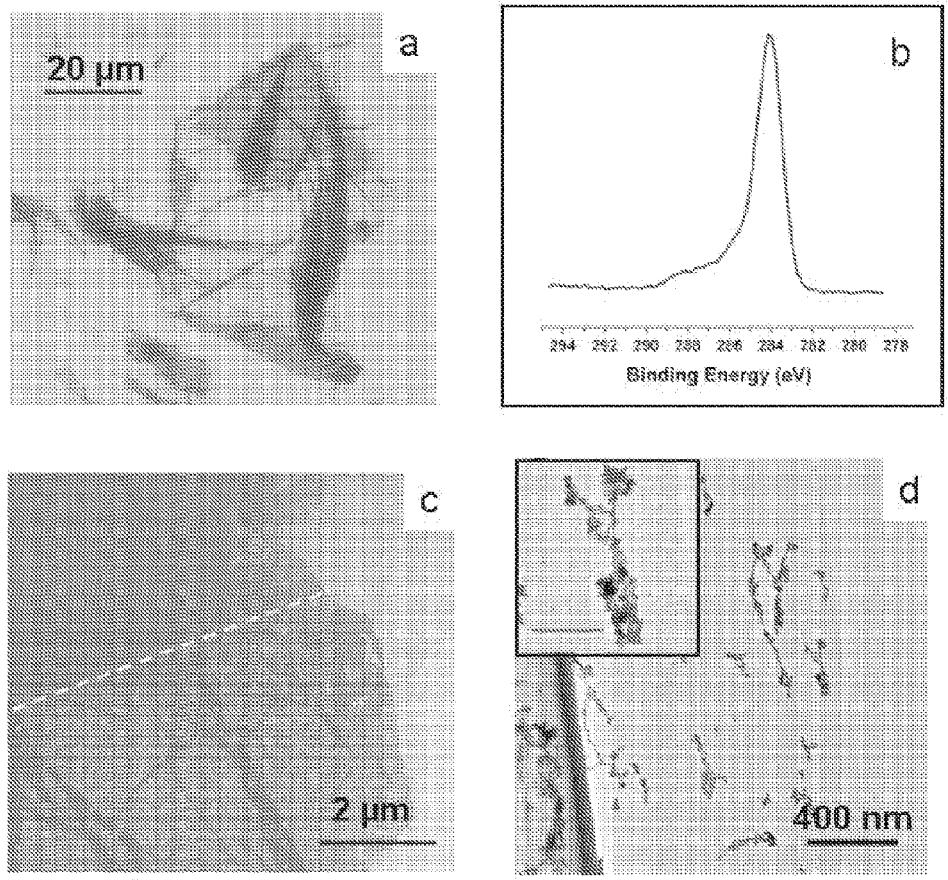
FIG. 9 shows data relating to the removal of carbon layers from GO-chemically converted graphene (GO-CCG).

FIG. 9A is the SEM image of a former monolayer GO flake with folded areas that had been exposed to one Al/NaOH treatment. The Al metal was sputter coated on the flake and then dissolved by concentrated aqueous NaOH. The image is similar to the image of GO after treatment by Zn/HCl (FIGS. 1-2). The treatment leaves only the folded outline of the original GO flake. Hence, the original flake had areas of one, two and three layers. The treated flake contains areas of one and two layers along with wrinkles that survived the Al/NaOH treatment.

The XPS analysis of the GO film exposed to one standard treatment shows that the remaining layers have the characteristics of CCG. The C1s XPS spectrum (FIG. 9B) contains one main peak at 284.1 eV with small shoulders on the left corresponding to carbon atoms with several oxygen functionalities. The spectrum is typical for GO reduced to CCG by hydrazine or other reducing agents.

On several occasions, Applicants observed residue from the layer that had been removed but remained on the lower layer (FIGS. 9C-9D). Panel "c" shows a GO flake with a border (dashed line) between the Zn/HCl treated and HCl-only treated areas. The Zn-untreated top-left area remained dark. On the Zn/HCl-treated area, one can see white elongated shapeless pieces of residue up to 1 μm in length. This residue is observed on the treated areas of the flake only. It is not found on the untreated areas of the flake or on the bare SiO$_2$ surface, while the entire sample was exposed to the HCl solution. This observation suggests that the residue came from the treated area of the GO flake and is not extrinsic. This residue is lightly colored in the SEM image (FIG. 9C) and dark in TEM (FIG. 9D). As one can see from the inset of FIG. 9D, the residue consists of nm-sized aggregated flakes. Efficient washing can remove most of this remaining residue from the surviving layer.

Without being bound by theory, Applicants also envision the agent that is removing the top carbon layer to likely be atomic hydrogen, based on their further work with GO, in which Applicants achieved the same selective removal result by coating a GO flake with Al metal and dissolving the latter in concentrated aqueous NaOH (FIG. 9A). Though different metals and media, the two methods both generate atomic hydrogen. In a control experiment, zinc sputtered atop a GO film was dissolved in two complementary manners: electrochemically and with HNO$_3$, and no carbon layers were removed. In both of these control experiments, atomic hydrogen is not expected to form. Therefore, the key chemical means by which individual layers are removed is by atomic hydrogen generation in close proximity to the carbon surface. This can only occur when the metal is directly applied to the carbon layer. No carbon layers were removed when Zn powder or Zn pieces were used instead of coating zinc directly on the surface of the carbon material by sputtering. Hence, intimate contact of the metal with the carbon layer is important. Once the near-surface layer of metal is consumed, the atomic hydrogen generated is not sufficiently close to the remaining graphene to cause its severe degradation.

To further understand the mechanism, the XPS spectrum of a multilayer GO film exposed to one Zn/HCl treatment shows that the remaining layer is reduced, since its C1s XPS spectrum is typical for that of CCG (FIG. 9B). The atomic hydrogen, while removing the top carbon layer with which the metal was in contact, apparently reduces the lower GO layer, thus converting it to CCG. On some occasions Applicants found residue from the removed top layer remaining on the lower surviving layers (FIGS. 9C-D).

EXAMPLE 4

Materials and Methods

Example 4.1

Patterning of the Few Layered Graphene Silicon Wafer

For patterning of the few-layer graphene (FLG), zinc was deposited on the targeted areas according to the following procedure (FIG. 1A). The graphene-coated Si/SiO$_2$ substrate was spin-coated with poly(methyl methacrylate) (PMMA). The target area patterns were made by e-beam lithography. After removing PMMA from the e-beam exposed areas by dissolution with developer (a mixture of isopropanol and methyl isobutyl ketone in a 3:1 ratio; both from Sigma-Aldrich), the sample was sputter-coated with 5 nm of zinc metal. The remaining PMMA was washed from the unexposed area with acetone, removing the zinc that had been deposited on top of the PMMA but leaving the zinc on the targeted areas that did not have PMMA. The zinc was dissolved from the targeted areas by immersing the sample in dilute HCl solution (typically 0.02 to 0.1 M; the latter being preferred if all zinc residues need to be removed). It takes a few seconds to dissolve 5 nm of zinc, but the samples were kept in the acid for 3 to 5 min. Dissolving the zinc results in removal of one atomic layer of carbon material. Finally, samples were rinsed with water and air dried. This constitutes the protocol used for all results in the Examples. To remove the second carbon layer the entire procedure was repeated. A different pattern can be used for the second treatment.

Although the results described in the Examples were performed as just described, we later found that washing the sample for several hours can aid in removing the majority of the scattered surface debris. The chip was clamped in a beaker and a mechanical stir motor with glass shaft and Teflon paddle was used to rapidly wash the HCl solution over the chip surface. The higher the concentrations of HCl, the more rapidly the traces of debris are removed. Applicants avoided sonication to prevent delamination of the layers, although that process might work. When HNO$_3$ (7.8 M) was used instead of HCl, a carbon layer was efficiently removed from GO but less efficiently from CVD graphene. Likewise, when acetic acid (0.8 M) was used instead of HCl, a carbon layer was efficiently removed from GO but less efficiently from CVD graphene.

Example 4.2

Sputter Coating

Sputter-coating was performed on CrC-150 sputtering system from TORR International, Inc. The air was pumped out until the pressure in chamber reached $5.0 \times 10^{-5}$ mm Hg. Sputtering was carried out at $P=5.0 \times 10^{-3}$ to $1.0 \times 10^{-2}$ mmHg. The DC current applied was 100±2 mA. The thickness of sputtered layer was controlled by FTM-2000 thickness monitor (QCM). A 5-nm-thick metal coating was usually used, but the process worked equally well throughout the range studied: 2 to 20-nm-thick metal films. (In the singular case where we thermally evaporated zinc onto CVD-graphene for the control study, a resistivity evaporator at $P=5.0 \times 10^{-6}$ mm Hg was used and the zinc thickness was >20 nm).

Example 4.3

Deposition of GO Flakes on a Silicon Wafer

To deposit GO flakes on the silicon wafer, Si/SiO$_2$ substrates were immersed in an aqueous GO solution and then lifted out of the solution with GO flakes adhering to the surface of the wafer. Then the samples were rinsed with water and air dried. By varying the solution concentration and the time of immersion of the substrate in the solution, one can control the coverage density and to some extent the number of GO layers on the SiO$_2$ surface. Typically, for dilute solutions (0.01-0.02 mg/mL) and short periods of time (10-30 s), most of the flakes were monolayer with some having two layers. Deposition from concentrated solutions (0.1-0.5 mg/mL) and for longer times (1-5 min) resulted in a continuous GO film where overlapping and/or folding of flakes produced areas with up to 4-6 layers.

Example 4.4

Removing Carbon Layers from Micromechanically Cleaved Graphene

The graphene samples were prepared by tapping and shearing graphite onto the surface of a Si/SiO$_2$ wafer. It is difficult to detect the removal of one carbon layer from a multi-layer flake by AFM. For that reason, in many cases we applied several sequential Zn/HCl treatments in order to be able to detect any changes in height. FIG. 5 represents AFM images along with height profiles from the treatment of one such flake. The height of the original flake was 0.86 nm in the thinnest area and 2.54 nm in the thickest area, when profiled across the shortest dimension (FIGS. 5A-5B), which corresponds to 2 and 7 layers of graphene, respectively. The flake was first exposed to one Zn/HCl treatment. The heights changed to 0.38 nm and 2.21 nm (FIGS. 5C-5D), which corresponds to removal of one graphene layer. Next, the sample was exposed to three sequential treatments of Zn/HCl. As seen in FIGS. 5E-5F, no material was present where the flake's main body had been. Only the folded areas at the edges and the multi-layered area were detectable. Except for these areas, the height profile lines (FIG. 5F) were flat. The data supports a conclusion that the few existing carbon layers were removed in the four sequential treatments. Additional data shown in FIG. 6 demonstrates consistency of the method.

Example 4.5

Metal-Sputtered GO Samples

Figure 7:
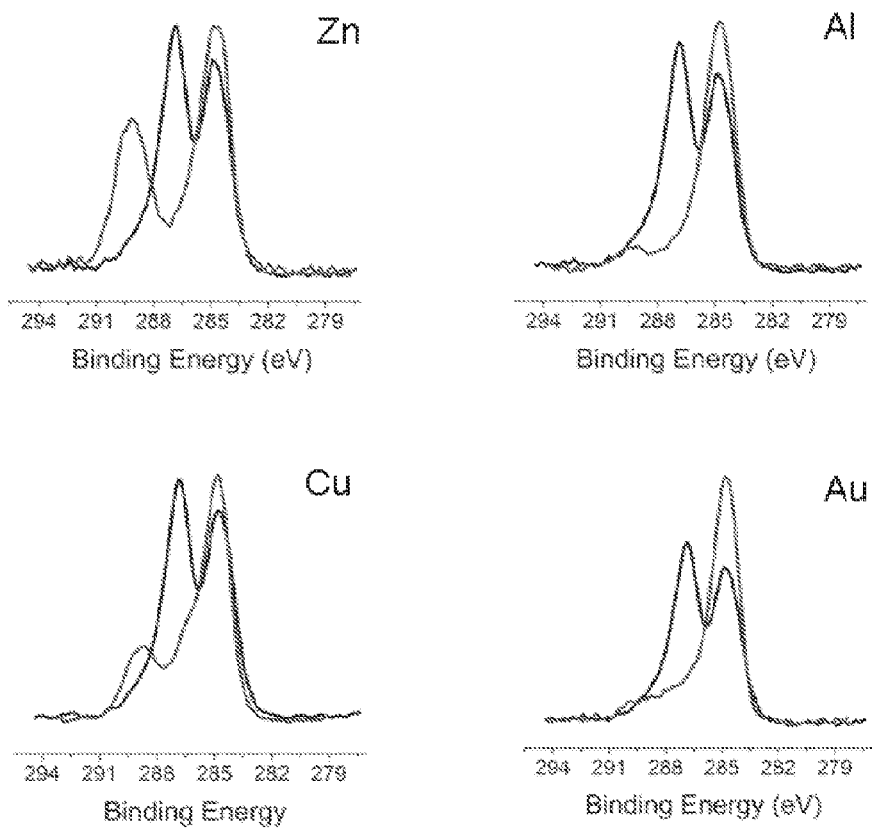
FIG. 7 shows C1s XPS spectra of GO samples sputter-coated with 0.6 nm of the four metals: zinc, aluminum, copper or gold (red lines) versus the starting GO precursor (black lines).

GO samples sputter-coated with metals behave differently than does CVD graphene under similar conditions. While graphene is partially oxidized, GO is reduced (FIG. 7). The C1s spectra of the original GO exhibits two major peaks: C—C carbon at 284.8 eV, and carbon of alcohols and epoxides at 286.6 eV. Also there is a shoulder in 288.5-289.5 eV region that is the carbon from the carbonyls. After sputter-coating with the metals, the content of alcohols and epoxides (~286.6 eV) is significantly reduced, while the content of carbonyls (288.0-289.0 eV) increases greatly for zinc. However, there was little change for aluminum, an increased change for copper and a slight increase for gold. C1s XPS spectra of GO samples sputter-coated with aluminum, copper, or gold look very similar to the corresponding spectra of sputter-coated CVD graphene samples (FIGS. 4D-4E). This suggests that sputter-coating produces similar products when two different starting materials are treated. The spectrum of the zinc-sputtered sample is unique. It shows the significant presence of carbonyl groups at 288.0-289.0 eV. Interestingly, the alcohol and epoxide groups, which dominate the precursor GO sample (peak at 286.5 eV) are significantly reduced after sputter-coating. Sputter-coating of aluminum and gold yields products different from the one produced by sputter-coating with zinc. The carbonyl peak is much smaller with aluminum, and only a shoulder in the 286.0 eV-291.0 eV region is distinguishable with gold. Sputtering GO with copper also causes significant disproportionation though a large amount of alcohols and epoxides remain. The Raman spectra of metal-sputtered GO samples are unchanged from the spectrum of the precursor GO. Therefore, in the case of zinc, the GO could be disproportionating, converting alcohol and epoxide functionalities to both carbon and carbonyls, as observed by the XPS data (FIG. 7). Again, zinc leads to the most changes in the GO structure when compared to aluminum, copper or gold. Treatment of CVD graphene and GO with sputtered zinc yields products with defective carbon layers and a significant content of carbonyl carbons.

Example 4.6

Spatial Resolution of the Method

The resolution appears to be limited only by the patterning operations (PMMA mask), not by the Zn/HCl method production. FIG. 8 shows an SEM image of a 100 nm-wide graphene removal made in single-layer CVD graphene by the Zn/HCl method. The width of the patterned zinc line and the subsequent trench are the same by SEM analysis at this resolution.

Without further elaboration, it is believed that one skilled in the art can, using the description herein, utilize the present invention to its fullest extent. The embodiments described herein are to be construed as illustrative and not as constraining the remainder of the disclosure in any way whatsoever. While the preferred embodiments have been shown and described, many variations and modifications thereof can be made by one skilled in the art without departing from the spirit and teachings of the invention. Accordingly, the scope of protection is not limited by the description set out above, but is only limited by the claims, including all equivalents of the subject matter of the claims. The disclosures of all patents, patent applications and publications cited herein are hereby incorporated herein by reference, to the extent that they provide procedural or other details consistent with and supplementary to those set forth herein.

What is claimed is:

1. A method of removing a single graphene layer from a graphene material, wherein the method comprises:
    a. applying a metal to a surface of the graphene material, wherein the graphene material has multiple graphene layers; and
    b. applying a hydrogen containing solution to the surface of the graphene material that is associated with the metal, wherein the hydrogen containing solution dissolves the metal along with a single layer of graphene associated with the metal, thereby removing the single layer of graphene from the graphene material.

2. The method of claim 1, further comprising rinsing the graphene material, wherein the rinsing occurs after applying the hydrogen containing solution to the surface of the graphene material.

3. The method of claim 1, further comprising drying the graphene material, wherein the drying occurs after applying the hydrogen containing solution to the surface of the graphene material.

4. The method of claim 1, wherein the metal is applied to a targeted site on the surface of the graphene material.

5. The method of claim 1, wherein the metal is applied to the entire surface of the graphene material.

6. The method of claim 1, wherein graphene layers on the graphene material that are not associated with the metal remain intact after the removal of the single layer of graphene from the graphene material.

7. The method of claim 1, wherein the graphene material is selected from the group consisting of graphene oxide, chemically converted graphene, partially reduced graphene oxide, chemical vapor deposited graphene, micromechanically cleaved graphene, graphite, highly ordered pyrollitic graphite, graphite oxide, and combinations thereof.

8. The method of claim 1, wherein the metal is applied to the surface of the graphene material by sputtering, thereby forming sputtered metal atoms on the surface of the graphene material.

9. The method of claim 1, wherein the metal is at least one of Zn, Al and Mg.

10. The method of claim 1, wherein the metal is selected from the group consisting of Ni, Co, Fe, Pt, Au, Al, Ca, Cr, Cu, Mg, Mn, Mo, Rh, Si, Ta, Ti, W, U, V, Zr, and combinations thereof.

11. The method of claim 1, wherein the metal has an oxidation potential greater than 0.5 Volts.

12. The method of claim 1, wherein the hydrogen containing solution is an acidic solution comprising hydrochloric acid.

13. The method of claim 1, wherein the hydrogen containing solution is a basic solution comprising sodium hydroxide.

14. The method of claim 1, wherein the hydrogen containing solution is selected from the group consisting of acidic solutions, basic solutions, neutral solutions, aqueous solutions, non-aqueous solutions, and combinations thereof.

15. A method of selectively removing one or more graphene layers from a graphene material, wherein the method comprises:
    a. applying a metal to a surface of the graphene material by sputtering,
        wherein the graphene material has multiple graphene layers; and
    b. applying a hydrogen containing solution to the surface of the graphene material that is associated with the metal,
        wherein the hydrogen containing solution dissolves the metal along with one or more layers of graphene associated with the metal, thereby removing the one or more layers of graphene from the graphene material.

16. The method of claim 15, wherein the number of graphene layers removed from the graphene material is controlled by sputtering power.

17. The method of claim 16, wherein a single layer of graphene is removed from the graphene material.

18. The method of claim 16, wherein two layers of graphene are removed from the graphene material.

19. The method of claim 15, wherein the metal is applied to a targeted site on the surface of the graphene material.

20. The method of claim 15, wherein the graphene material is selected from the group consisting of graphene oxide, chemically converted graphene, partially reduced graphene oxide, chemical vapor deposited graphene, micromechanically cleaved graphene, and combinations thereof.

21. The method of claim 15, wherein the metal is at least one of Zn, Al and Mg.

22. The method of claim 15, wherein the hydrogen containing solution is selected from the group consisting of acidic solutions, basic solutions, neutral solutions, aqueous solutions, non-aqueous solutions, and combinations thereof.

* * * * *